(12) United States Patent
Chen et al.

(10) Patent No.: US 12,206,403 B2
(45) Date of Patent: Jan. 21, 2025

(54) SWITCH CIRCUIT STRUCTURE HAVING REDUCED CROSSOVERS AND LAYOUT SYSTEM THEREOF

(71) Applicant: RichWave Technology Corp., Taipei (TW)

(72) Inventors: Chih-Sheng Chen, Taipei (TW); Yi-Bin Yang, Taipei (TW)

(73) Assignee: RichWave Technology Corp., Taipei (TW)

( * ) Notice: Subject to any disclaimer, the term of this patent is extended or adjusted under 35 U.S.C. 154(b) by 390 days.

(21) Appl. No.: 17/510,399

(22) Filed: Oct. 26, 2021

(65) Prior Publication Data

US 2023/0061516 A1 Mar. 2, 2023

(30) Foreign Application Priority Data

Sep. 2, 2021 (TW) .................................. 110132541

(51) Int. Cl.
| | |
|---|---|
| H03K 17/693 | (2006.01) |
| H01P 1/10 | (2006.01) |
| H04B 1/44 | (2006.01) |

(52) U.S. Cl.
CPC .............. *H03K 17/693* (2013.01); *H01P 1/10* (2013.01); *H04B 1/44* (2013.01)

(58) Field of Classification Search
CPC ............ H03K 17/693; H01P 1/10; H04B 1/44
See application file for complete search history.

(56) References Cited

U.S. PATENT DOCUMENTS

| | | | | |
|---|---|---|---|---|
| 8,769,469 | B1 * | 7/2014 | Howard | G06F 30/394 |
| | | | | 716/132 |
| 9,157,952 | B2 * | 10/2015 | Becker | G01R 31/2844 |
| 11,444,652 | B1 * | 9/2022 | Kaiser, Jr. | H03D 7/1441 |
| 2002/0063475 | A1 | 5/2002 | Freeston | |
| 2003/0048150 | A1 * | 3/2003 | Clarke | H01P 1/12 |
| | | | | 333/101 |

(Continued)

FOREIGN PATENT DOCUMENTS

| | | |
|---|---|---|
| TW | I601261 B | 10/2017 |
| TW | I666841 B | 7/2019 |
| TW | 202119790 A | 5/2021 |

OTHER PUBLICATIONS

Office action mailed on Jul. 13, 2022 for the Taiwan application No. 110132541, filing date Sept. 2, 2021, pp. 1-6.

*Primary Examiner* — Blake J Rubin
(74) *Attorney, Agent, or Firm* — Winston Hsu

(57) ABSTRACT

A switch device structure includes RF1-st and RF2-nd input terminals, RFA-th, RFB-th and RFC-th output terminals, P2A-th, P1B-th and P1C-th paths, and first and second common paths. The P2A-th path includes a first terminal, and a second terminal coupled to the RFA-th output terminal. The P1B-th path includes a first terminal, and a second terminal coupled to the RFB-th output terminal. The P1C-th path includes a first terminal, and a second terminal coupled to the RFC-th output terminal. The first common path is coupled to the RF2-nd input terminal and the first terminal of the P2A-th path. The second common path is coupled to the RF1-st input terminal, the first terminal of the P1B-th path, and the first terminal of the P1C-th path. The first and second common paths cross each other on different planes to form a crossover.

20 Claims, 9 Drawing Sheets

(56) References Cited

U.S. PATENT DOCUMENTS

| | | | | |
|---|---|---|---|---|
| 2004/0150008 A1* | 8/2004 | Preisach | ............... | H04L 49/101 |
| | | | | 257/203 |
| 2010/0225539 A1* | 9/2010 | Margomenos | .......... | G01S 7/032 |
| | | | | 342/373 |
| 2012/0139363 A1* | 6/2012 | Kerr | ........................ | H04B 1/48 |
| | | | | 307/115 |
| 2012/0262009 A1* | 10/2012 | Becker | ............... | G01R 31/2844 |
| | | | | 307/113 |
| 2016/0027571 A1* | 1/2016 | Zhang | ..................... | H01F 19/04 |
| | | | | 336/173 |
| 2016/0142036 A1* | 5/2016 | Akhtar | ................ | H01L 23/5227 |
| | | | | 29/605 |
| 2016/0155558 A1* | 6/2016 | Groves | ............... | H01F 17/0013 |
| | | | | 336/200 |
| 2017/0359056 A1* | 12/2017 | Horvath | ............... | H05K 1/0216 |
| 2017/0359058 A1* | 12/2017 | Bacon | ..................... | H01P 1/127 |
| 2019/0319023 A1 | 10/2019 | Ranta | | |
| 2020/0313294 A1* | 10/2020 | Morita | ............... | H01Q 21/0025 |
| 2021/0314006 A1* | 10/2021 | Verzola | ................. | H01H 11/00 |

* cited by examiner

SWITCH CIRCUIT STRUCTURE HAVING REDUCED CROSSOVERS AND LAYOUT SYSTEM THEREOF

CROSS REFERENCE TO RELATED APPLICATION

This non-provisional application claims priority of Taiwan patent application No. 110132541, filed on 2 Sep. 2021, included herein by reference in its entirety.

TECHNICAL FIELD

The invention relates to a radio frequency circuit, and in particular, to a switch device structure and a layout system thereof.

BACKGROUND

Radio Frequency (RF) switches may direct radio frequency signals via one or more transmission paths, and are widely used in televisions, mobile phones, wireless communication devices, and satellite communication devices.

In a radio frequency switch, a crossover will be produced when two non-intersecting transmission paths meet. At the crossover, one transmission path will pass over or under another transmission path, resulting in an increase in an insertion loss. When the RF switch is a multi-pole multi-throw switch, multiple transmission paths will generate a large number of crossovers, significantly degrading the signal quality of the multi-pole multi-throw switch.

SUMMARY

According to an embodiment of the invention, a switch circuit structure includes an RF1-st input terminal, an RF2-nd input terminal, an RFA-th output terminal, an RFB-th output terminal, an RFC-th output terminal, a P2A-th path, a P1B-th path, a P1C-th path, a first common path and a second common path. The P2A-th path includes a first terminal, and a second terminal coupled to the RFA-th output terminal. The P1B-th path includes a first terminal, and a second terminal coupled to the RFB-th output terminal. The P1C-th path includes a first terminal, and a second terminal coupled to the RFC-th output terminal. The first common path is coupled to the RF2-nd input terminal and the first terminal of the P2A-th path. The second common path is coupled to the RF1-st input terminal, the first terminal of the P1B-th path, and the first terminal of the P1C-th path. The first common path and the second common path cross each other on different planes to form a first crossover.

According to another embodiment of the invention, a layout system includes a memory and a processor. The memory is used to store code. The processor is coupled to the memory, and is used to load the code from the memory to receive a circuit setting of a switch circuit, the circuit setting comprising N input terminals, M output terminals and (N*M) switch paths, wherein N and M are positive integers, divide the (N*M) switch paths into N sets of switch paths according to the N input terminal, divide the N input terminals and the N sets of switch paths into a first set of circuits and a second set of circuits, and move one of the switch paths in the first set of circuits to reduce a quantity of crossovers of the switch path to update the first set of circuits.

DETAILED DESCRIPTION

Figure 1:
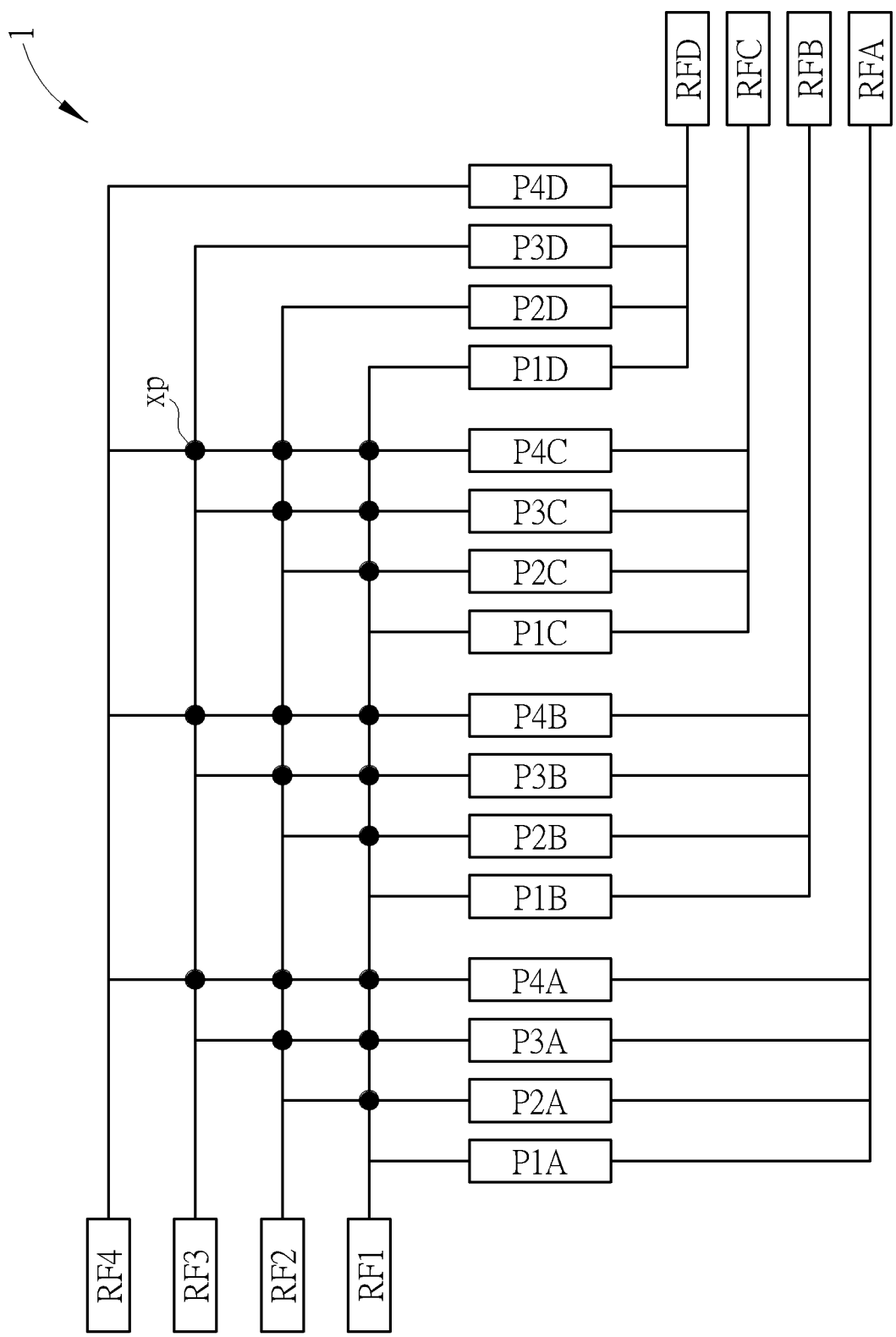
FIG. 1 is a circuit schematic of a switch circuit structure in the related art.

Below, exemplary embodiments will be described in detail with reference to accompanying drawings so as to be easily realized by a person having ordinary skills in the art. The inventive concept may be embodied in various forms without being limited to the embodiments set forth herein. Descriptions of well-known parts are omitted for clarity, and like reference numerals refer to like elements throughout.

Figure 2:
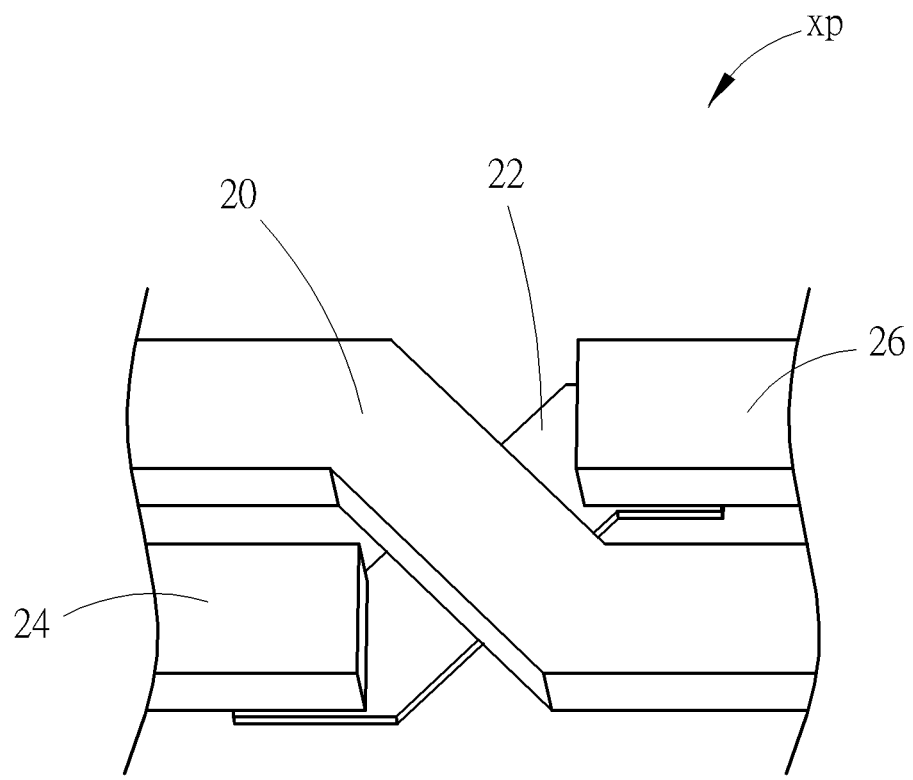
FIG. 2 is a schematic diagram of a crossover in FIG. 1.

FIG. 1 is a circuit schematic of a switch circuit structure 1 in the related art. The switch circuit structure 1 is a four-pole four-throw (4P4T) switch circuit, forming a path between one of four input terminals and one of four output terminals to transmit or receive radio frequency signals. The switch circuit structure 1 includes input terminals RF1 to RF4, output terminals RFA to RFD, and switch paths P1A to P4A, P1B to P4B, P1C to P4C, and P1D to P4D. Since the input terminals RF1 to RF4 cannot be connected to each other, the 16 paths between the input terminals RF1 to RF4 and the switch paths P1A to P4A, P1B to P4B, P1C to P4C, and P1D to P4D will form 18(=(1+2+3)*3) crossovers xp. FIG. 2 is a schematic diagram of a crossover xp. The crossover xp includes upper-layer traces 20, 24, 26 and a lower-layer trace 22. The upper traces 20, 24, 26 may be located on the upper metal layer, and the lower trace 22 may be located on the lower metal layer. The upper trace 24, the lower trace 22, and the upper trace 26 may be coupled in sequence. The upper trace 20 may be a portion of a first path, and the upper trace 24, 26 and the lower trace 22 may be a portion of a second path. The second path from the upper trace 24 to the lower trace 22 and then to the upper trace 26 will produce an insertion loss, resulting in a reduction of the signal quality of the second path. When the number of input terminals and/or output terminals of the switch circuit structure 1 increases, the number of crossovers xp will increase accordingly. For example, when the number of input terminals N of the switch circuit is equal to 3, the number of crossovers is equal to 6 (=(1+2)*2). When N is equal to 4, the number of crossovers is equal to 18. When N is equal to 5, the number of crossovers is equal to 40 (=(1+2+3+4)*4). The increased number of crossovers xp will increase the insertion loss, reducing the signal quality significantly.

Figure 3:
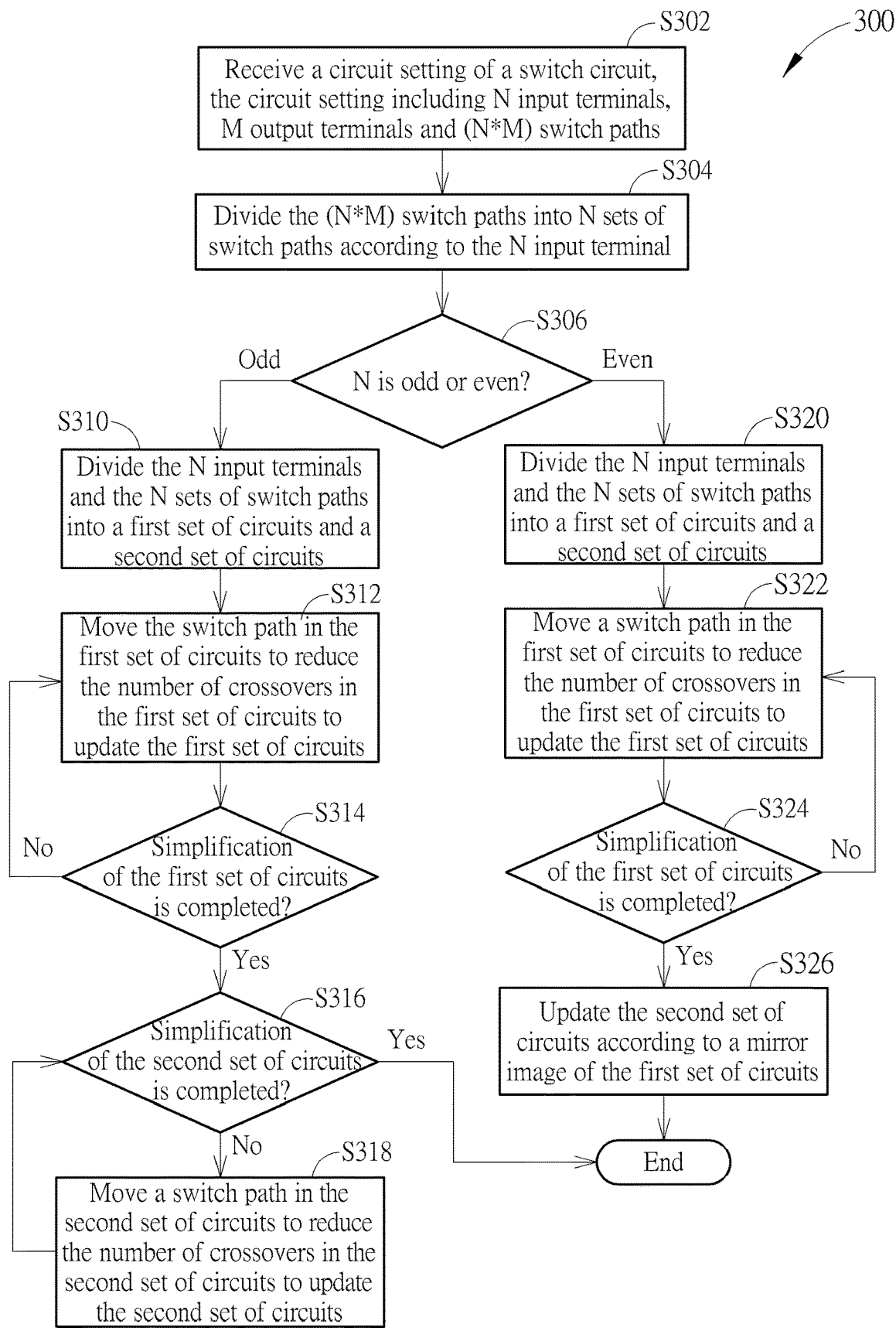
FIG. 3 is a flowchart of a layout method according to an embodiment of the invention.

FIG. 3 is a flowchart of a layout method 300 according to an embodiment of the invention. The layout method 300 is suitable for a layout system including a memory and a processor. The memory is used to store code for implementing the layout method 300. The processor is coupled to the memory, and is used to load the code from the memory to execute the layout method 300. The layout method 300 includes Steps S302 to S326 for reducing the number of crossovers xp of the switch circuit, so as to reduce the insertion loss. Steps S302 to S306 are used to initialize the circuit setting of a switch circuit. Steps S310 to S318 are used to reduce the number of crossovers xp for an odd number of input terminals of the switch circuit. Steps S320 to S326 are used to reduce the number of crossovers xp for an even number input terminals of the switch circuit. Any reasonable step change or adjustment is within the scope of the disclosure. Steps S302 to S326 are detailed as follows:

Step S302: Receive a circuit setting of a switch circuit, the circuit setting including N input terminals, M output terminals and (N*M) switch paths;

Step S304: Divide the (N*M) switch paths into N sets of switch paths according to the N input terminal;

Step S306: Determine whether N is odd or even? If N is odd, go to Step S310; if N is even, go to Step S320;

Step S310: Divide the N input terminals and the N sets of switch paths into a first set of circuits and a second set of circuits;

Step S312: Move the switch path in the first set of circuits to reduce the number of crossovers in the first set of circuits to update the first set of circuits;

Step S314: Determine whether the simplification of the first set of circuits is completed? If so, proceed to Step S316; and if not, go to Step S312;

Step S316: Determine whether the simplification of the second set of circuits is completed? If so, terminate the layout method 300; and if not, go to Step S318;

Step S318: Move a switch path in the second set of circuits to reduce the number of crossovers in the second set of circuits to update the second set of circuits; go to Step S316;

Step S320: Divide the N input terminals and the N sets of switch paths into a first set of circuits and a second set of circuits;

Step S322: Move a switch path in the first set of circuits to reduce the number of crossovers in the first set of circuits to update the first set of circuits;

Step S324: Determine whether the simplification of the first set of circuits is completed? If so, proceed to Step S326; and if not, go to Step S322;

Step S326: Update the second set of circuits according to a mirror image of the first set of circuits; terminate the layout method 300.

The Steps S310 to S326 are explained below with reference to a 4-pole 4-throw switch circuit. In Step S302, the circuit setting of a switch circuit is input to the processor by a user via an input interface, or received from a configuration file accessible by the processor. N and M are positive integers exceeding 1. In some embodiments, N is equal to M. For a 4-pole 4-throw circuit, the circuit configuration includes 4 input terminals, 4 output terminals, and 16 (=4*4) switch paths, and N and M are both equal to 4. In Step S304, the processor divides the 16 switch paths into 4 sets of switch paths according to the input terminals and merges the 4 sets of switch paths to generate 18 crossovers. For example, the processor may sort the switch paths P1A, P1B, P1C, P1D coupled the input terminal RF1 into a set of switch paths, sort the switch paths P2A, P2B, P2C, P2D coupled to the input terminal RF2 into a set of switch paths, sort the switch paths P3A, P3B, P3C, P3D coupled to the input terminal RF3 into a set of switch paths, and sort the switch paths P4A, P4B, P4C, P4D coupled to the input terminal RF4 into a set of switch paths. The 18 crossovers may be generated between the input terminals RF1 to RF4 and the switch paths P1A to P4A, P1B to P4B, P1C to P4C, P1D to P4D, between the switch paths P1A to P4A, P1B to P4B, P1C to P4C, P1D to P4D and the output terminals RFA to RFD, or partly between the input terminals RF1 to RF4 and the switch paths P1A to P4A, P1B to P4B, P1C to P4C, P1D to P4D, and partly between the switch paths P1A to P4A, P1B to P4B, P1C to P4C, P1D to P4D and the output terminals RFA to RFD. For example, in FIG. 1, the 18 crossovers are generated between the input terminals RF1 to RF4 and the switch paths P1A to P4A, P1B to P4B, P1C to P4C, P1D to P4D. In Step S306, the processor determines that 4 (=N) is an even number, and proceeds to Step S320.

Figure 4:
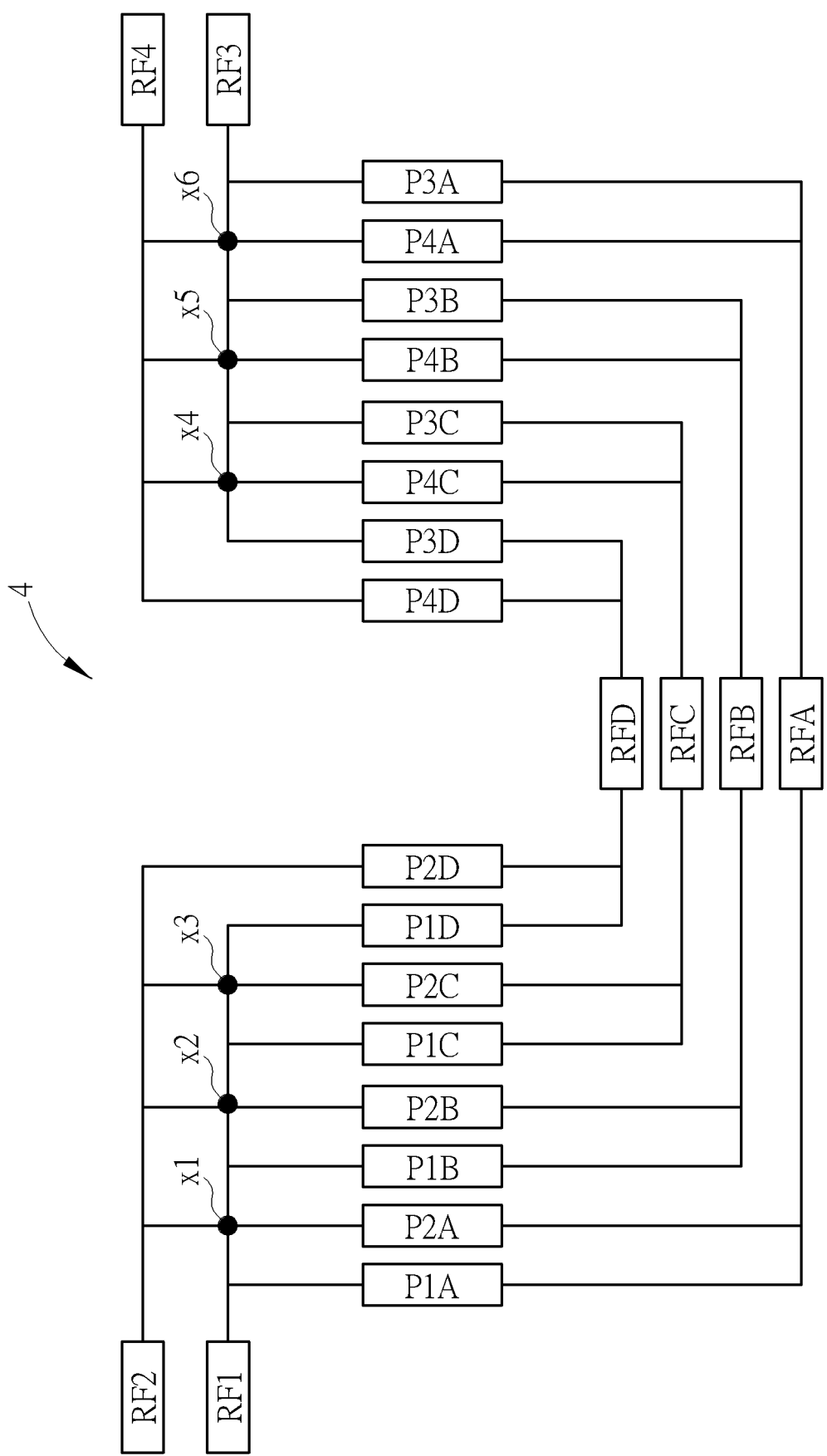
FIG. 4 is a schematic diagram of a switch circuit structure generated in a step of the layout method in FIG. 3.

In Step S320, the first set of circuits and the second set of circuits each include 2(=4/2) input terminals and corresponding 2(=4/2) sets of switch paths. FIG. 4 is a schematic diagram of a switch circuit structure 4 generated in Step S320 of the layout method 300. In FIG. 4, the switch circuit structure 4 is symmetrical and includes a first set of circuits and a second set of circuits. The first set of circuits includes input terminals RF1, RF2 and corresponding 2 sets of switch paths, and the second set of circuits includes input terminals RF3, RF4 and corresponding 2 sets of switch paths. The first set of circuits includes crossovers x1 to x3, and the second set of circuits includes crossovers x4 to x6. In Step S322, the processor moves the switch path having the maximum number of crossovers in the first set of circuits to reduce the number of crossovers, thereby updating the first set of circuits. For example, in FIG. 4, the switch paths P2A, P2B, and P2C in the first set of circuits respectively form crossovers x1, x2, and x3. The switch paths P1A, P1B, and P1C do not form any crossover, and therefore, the switch paths P2A, P2B and P2C are switch paths having the maximum number of crossovers in the first set of circuits. Nevertheless, moving the switch path P2A will not reduce the number of crossovers, moving the switch path P2B to the left will reduce the number of crossovers, and moving the switch path P2B to the right will not reduce the number of crossovers. If the switch path P2B is moved to the left, moving the switch path P2C to the left or right will not reduce the number of crossovers, and consequently, the processor only moves the switch path P2B to between the switch paths P2A and P1B to remove the crossover x2.

Figure 5:
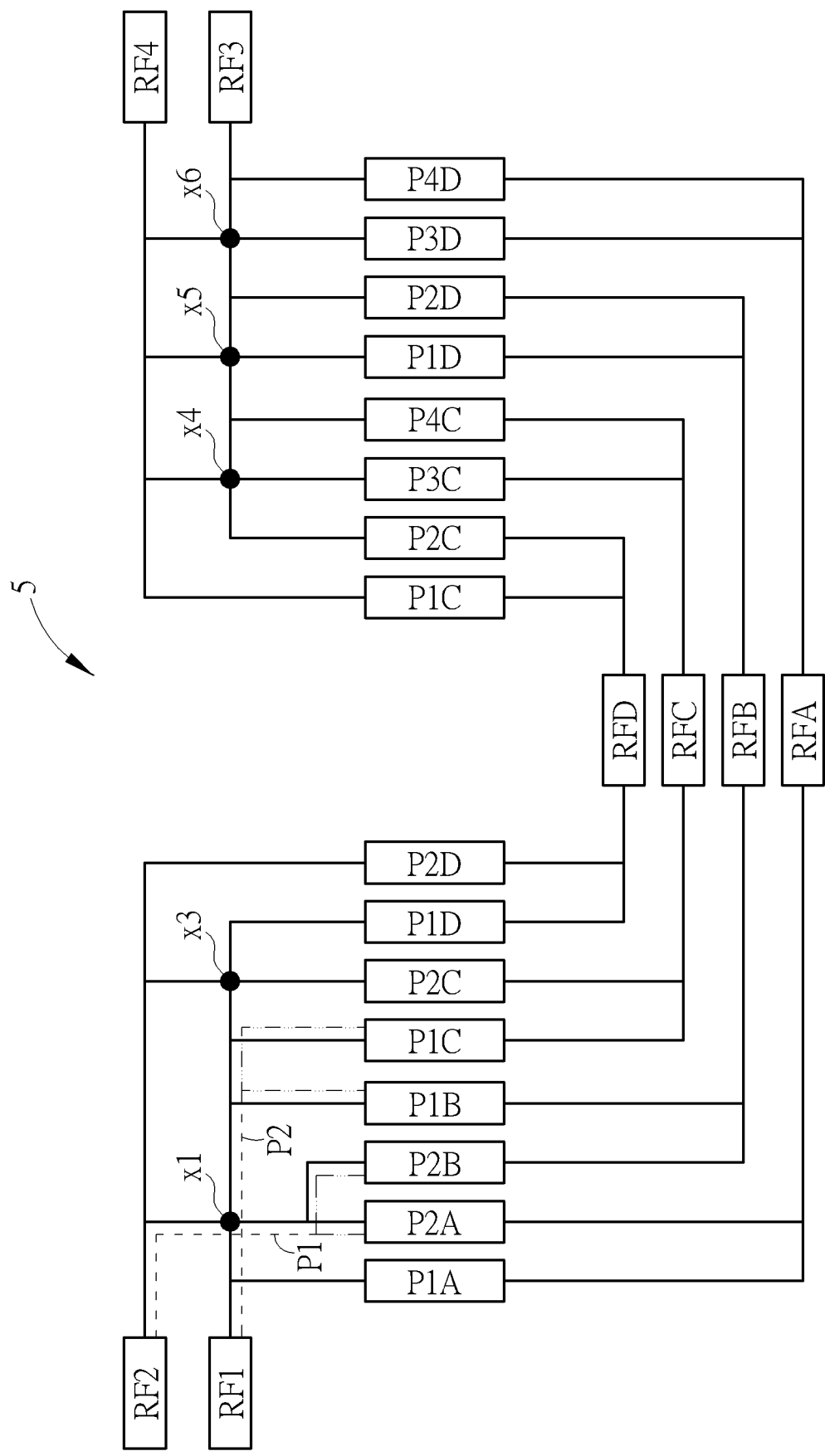
FIG. 5 is a schematic diagram of a switch circuit structure generated in another step of the layout method in FIG. 3.
Figure 6:
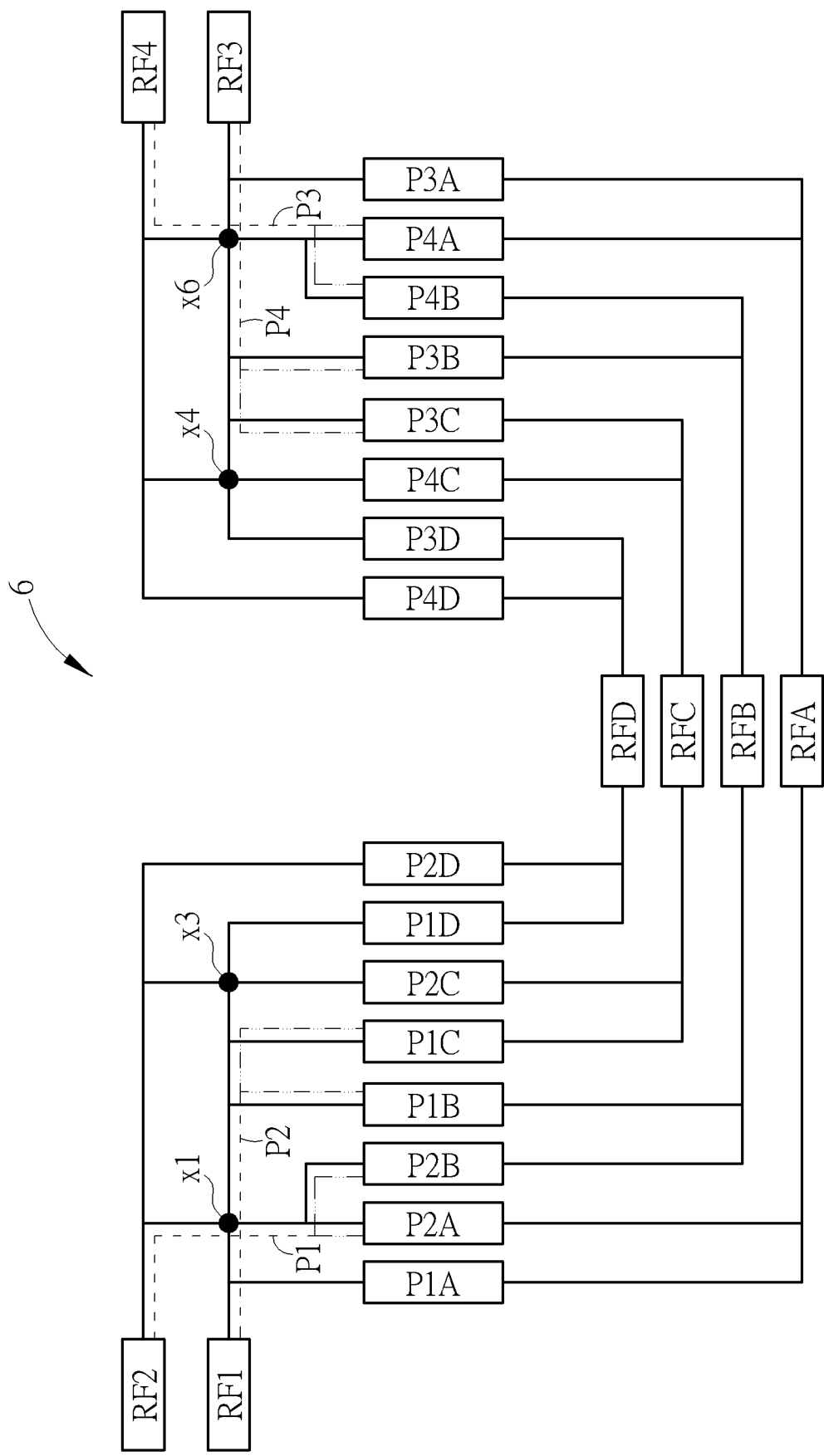
FIG. 6 is a schematic diagram of a switch circuit structure generated in another step of the layout method in FIG. 3.

FIG. 5 is a schematic diagram of a switch circuit structure 5 generated in Step S322 of the layout method 300. In FIG. 5, the switch path P2B is moved to between the switch paths P2A and P1B to remove the crossover x2, the switch paths P2A and P2B are coupled to the input terminal RF2 via a first common path P1, and the switch paths P1B and P1C are coupled to the input terminal RF1 via a second common path P2. In Step S324, since moving the switch path P2A or P2C will not reduce the number of crossovers, the processor determines that the simplification of the first set of circuits is completed, and proceeds to Step S326. In Step S326, since the original first set of circuits and the original second set of circuits are symmetrical in the switch circuit structure 5, the structure of the simplified first set of circuit should also be symmetrical to the simplified second set of circuit, and the processor updates the second set of circuits using the mirror image of the first set of circuits. Next, the processor merges the updated first set of circuits and the updated second set of circuits to update the switch circuit structure, and terminates the layout method 300. FIG. 6 is a schematic diagram of a switch circuit structure 6 generated in Step S326 of the layout method 300. In FIG. 6, the switch path P4B is moved to between the switch paths P4A and P3B to remove the crossover x5, the switch paths P4A and P4B are coupled to the input terminal RF4 via a third common path P3, and the switch paths P3B and P3C are coupled to the input terminal RF3 via a fourth common path P4.

Figure 7:
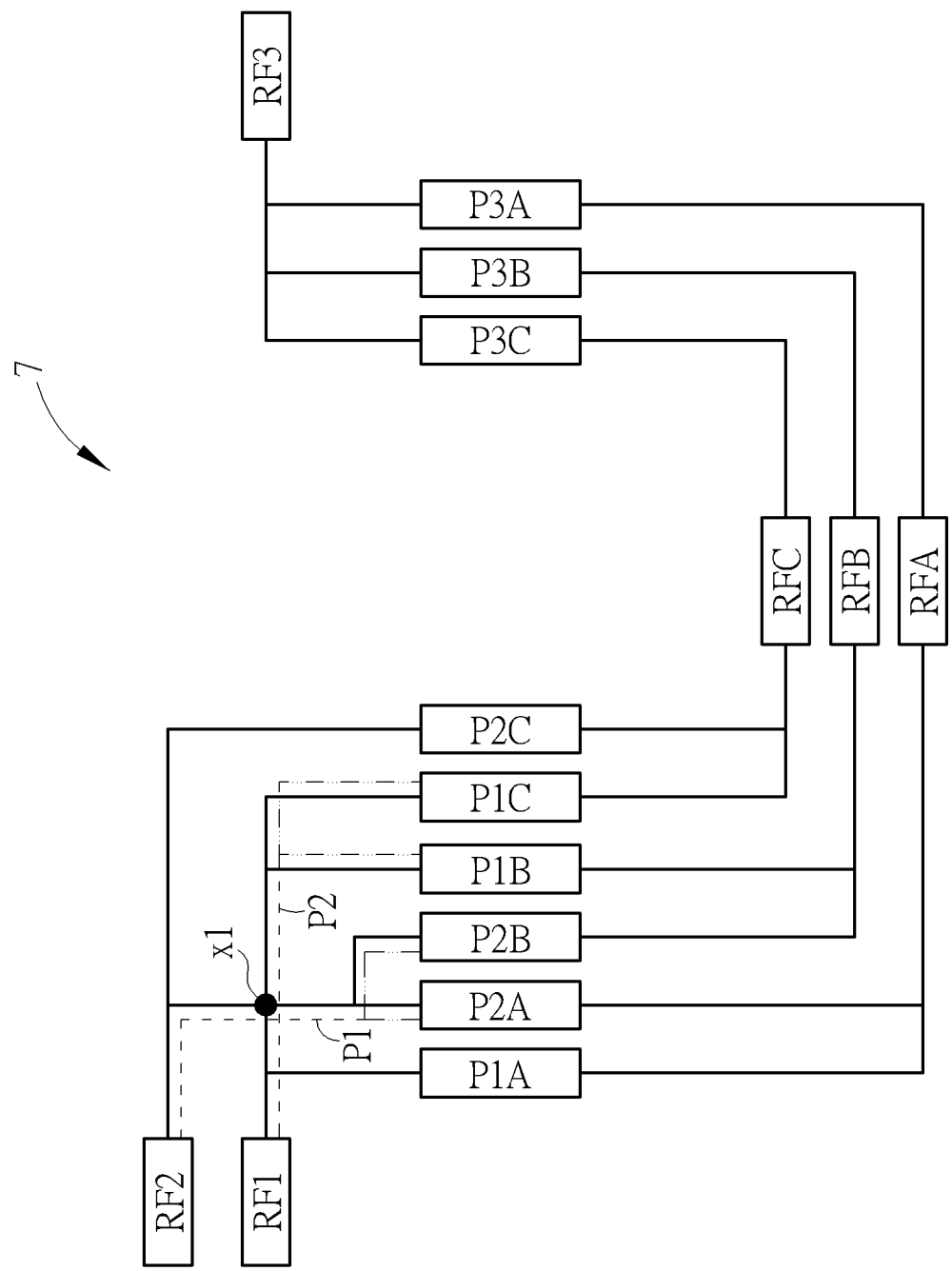
FIG. 7 is a schematic diagram of a switch circuit structure according to another embodiment of the invention.

If in Step S306, the processor determines that N is an odd number, e.g., N=3 as shown in FIG. 7, then proceeds to Step S310. In Step S310, the first set of circuits includes 2(=(3+1)/2) input terminals and corresponding 2 sets of switch paths, and the second set of circuits includes 1(=(3−1)/2) input terminal and corresponding 1 set of switch paths. For example, when N=3, the switch circuit structure 6 is asymmetrical and includes a first set of circuits and a second set of circuits. The first set of circuits includes input terminals RF1, RF2 and corresponding 2 sets of switch paths, and the second set of circuits includes input terminals RF3 and corresponding 1 set of switch paths. Since the first set of circuits and the second set of circuits are asymmetrical, the processor will simplify the first set of circuits and the second set of circuits separately. In Step S312, the processor moves the switch paths having the maximum number of crossovers in the first set of circuits to reduce the number of crossovers, thereby updating the first set of circuits. In Step S314, the processor determines whether the simplification of the first set of circuits is completed. If not, the processor executes Step S312 again until the simplification of the first set of circuits is completed. If so, in Step S316, the processor moves a switch path having the maximum number of crossovers in the second set of circuits to reduce the number of crossovers, thereby updating the second set of circuits. In Step S318, the processor determines whether the simplification of the second set of circuits has been completed. If not, the processor executes Step S316 again until the simplification of the second set of circuits is completed. If so, the processor merges the updated first set of circuits and the updated second set of circuits to update the switch circuit, and terminates the layout method 300.

When N is equal to M, the number of crossovers generated by the layout method 300 is equal to a square of (N−2). For example, when N is equal to 3, the number of crossovers is equal to 1 (=(3−2)^2); when N is equal to 4, the number of crossovers is equal to 4 (=(4−2)^2); when N When it is equal to 5, the number of crossovers is equal to 9 (=(5−2)^2). Compared to the number of crossovers in the related art, when N is equal to 3, the number of crossovers is reduced from 6 to 1. When N is equal to 4, the number of crossovers is reduced from 18 to 4. When N is equal to 5, the number of crossovers is reduced from 40 to 9. Therefore, using the layout method 300 can significantly reduce the number of crossovers, reducing the insertion loss, and enhancing the signal quality.

In FIG. 6, the switch circuit structure 6 includes input terminals RF1 to RF4, output terminals RFA to RFD, switch paths P1A to P4A, P1B to P4B, P1C to P4C, P1D to P4D, a first common path P1, a second common path P2, a third common path P3, and a fourth common path P4.

The switch path P1A includes a first terminal, and a second terminal coupled to the output terminal RFA. The switch path P2A includes a first terminal, and a second terminal coupled to the output terminal RFA. The switch path P2B includes a first terminal, and a second terminal coupled to the output terminal RFB. The switch path P1B includes a first terminal, and a second terminal coupled to the output terminal RFB. The switch path P1C includes a first terminal, and a second terminal coupled to the output terminal RFC. The switch path P2C includes a first terminal, and a second terminal coupled to the output terminal RFC. The switch path P1D includes a first terminal, and a second terminal coupled to the output terminal RFD. The switch path P2D includes a first terminal, and a second terminal coupled to the output terminal RFD. The first common path P1 is coupled to the input terminal RF2, the first terminal of the switch path P2A, and the first terminal of the switch path P2B. The second common path P2 is coupled to the input terminal RF1, the first terminal of the switch path P1B, and the first terminal of the switch path P1C. The first common path P1 and the second common path P2 cross each other on different planes to form a crossover x1. The path from the input terminal RF2 to the switch path P2C and the path from the input terminal RF1 to the switch path P1D cross each other on different planes to form a crossover x3. The distances between the switch paths P1A, P2A, P2B, P1B, P1C, P2C, P1D, P2D and the input terminals RF1, RF2 increase in sequence.

The switch path P3A includes a first terminal, and a second terminal coupled to the output terminal RFA. The switch path P4A includes a first terminal, and a second terminal coupled to the output terminal RFA. The switch path P4B includes a first terminal, and a second terminal coupled to the output terminal RFB. The switch path P3B includes a first terminal, and a second terminal coupled to the output terminal RFB. The switch path P3C includes a first terminal, and a second terminal coupled to the output terminal RFC. The switch path P4C includes a first terminal, and a second terminal coupled to the output terminal RFC. The switch path P3D includes a first terminal, and a second terminal coupled to the output terminal RFD. The switch path P4D includes a first terminal, and a second terminal coupled to the output terminal RFD. The third common path P3 is coupled to the input terminal RF4, the first terminal of the switch path P4A, and the first terminal of the switch path P4B. The fourth common path P4 is coupled to the input terminal RF3, the first terminal of the switch path P3B, and the first terminal of the switch path P3C. The third common path P3 and the fourth common path P4 cross each other on different planes to form a crossover x6. The path from the input terminal RF4 to the switch path P4C and the path from the input terminal RF3 to the switch path P3D cross each other on different planes to form a crossover x4. The distances between the switch paths P3A, P4A, P4B, P3B, P3C, P4C, P3D, and P4D and the input terminals RF3, RF4 increase in sequence.

The input terminal RF1 may be coupled to the switch paths P1A, P1B, P1C, and P1D along paths in a first direction, the input terminal RF2 may be coupled to the switch paths P2A, P2B, P2C, and P2D along paths in the first direction, the input terminal RF3 may be coupled to the switch paths P3A, P3B, P3C, and P3D along paths in the first direction, and the input terminal RF4 may be coupled to the switch paths P4A, P4B, P4C, and P3D along paths in the first direction, herein the first direction could be vertical direction. The output terminal RFA may be coupled to the switch paths P1A, P2A, P3A, and P4A along paths in a second direction, the output terminal RFB may be coupled to the switch paths P1B, P2B, P3B, and P4B along paths in the second direction, the output terminal RFC may be coupled to the switch paths P1C, P2C, P3C, and P4C along paths in the second direction, and the output terminal RFD may be coupled to the switch paths P1D, P2D, P3D, and P3D along paths in the second direction, herein the second direction could be horizontal direction. The first direction may be the direction of arranging the output terminals RFA, RFB, RFC, and RFD, such as along a vertical direction. The second direction may be the direction of arranging the switch paths, such as along a horizontal direction. The first direction and the second direction may be different. In some embodiments, the first direction and the second direction may be perpendicular to each other.

FIG. 7 is a schematic diagram of a switch circuit structure 7 according to another embodiment of the invention. The switch circuit structure 7 in FIG. 7 is a 3-pole 3-throw circuit. The switch circuit structure 7 includes input terminals RF1 to RF3, output terminals RFA to RFC, switch paths P1A to P3A, P1B to P3B, P1C to P3C, and a first common path P1 and a second common path P2.

The switch path P1A includes a first terminal, and a second terminal coupled to the output terminal RFA. The switch path P2A includes a first terminal, and a second terminal coupled to the output terminal RFA. The switch path P2B includes a first terminal, and a second terminal coupled to the output terminal RFB. The switch path P1B includes a first terminal, and a second terminal coupled to the output terminal RFB. The switch path P1C includes a first terminal, and a second terminal coupled to the output terminal RFC. The switch path P2C includes a first terminal, and a second terminal coupled to the output terminal RFC. The first common path P1 is coupled to the input terminal RF2, the first terminal of the switch path P2A, and the first terminal of the switch path P2B. The second common path P2 is coupled to the input terminal RF1, the first terminal of the switch path P1B, and the first terminal of the switch path P1C. The first common path P1 and the second common path P2 cross each other on different planes to form a crossover x1. The distances between the switch paths P1A, P2A, P2B, P1B, P1C, P2C and the input terminals RF1, RF2 increase in sequence.

The switch path P3A includes a first terminal, and a second terminal coupled to the output terminal RFA. The switch path P3B includes a first terminal, and a second terminal coupled to the output terminal RFB. The switch path P3C includes a first terminal, and a second terminal coupled to the output terminal RFC. The distances between the switch paths P3A, P3B, P3C and the input terminal RF3 increase in sequence.

The input terminal RF1 may be coupled to the switch paths P1A, P1B, and P1C along paths in a first direction, the input terminal RF2 may be coupled to the switch paths P2A, P2B, and P2C along paths in the first direction, and the input terminal RF3 may be coupled to the switch paths P3A, P3B, and P3C along paths in the first direction, herein the first direction could be vertical direction. The output terminal RFA may be coupled to the switch paths P1A, P2A, and P3A along paths in a second direction, the output terminal RFB may be coupled to the switch paths P1B, P2B and P3B along paths in the second direction, and the output terminal RFC may be coupled to the switch paths P1C, P2C, and P3C along paths in the second direction, herein the second direction could be vertical direction. The first direction may be the direction of arranging the output terminals RFA, RFB, and RFC, such as along the vertical direction. The second direction may be the direction of arranging the switch paths, such as along the horizontal direction. The first direction and the second direction may be different. In some embodiments, the first direction and the second direction may be perpendicular to each other.

Figure 8:
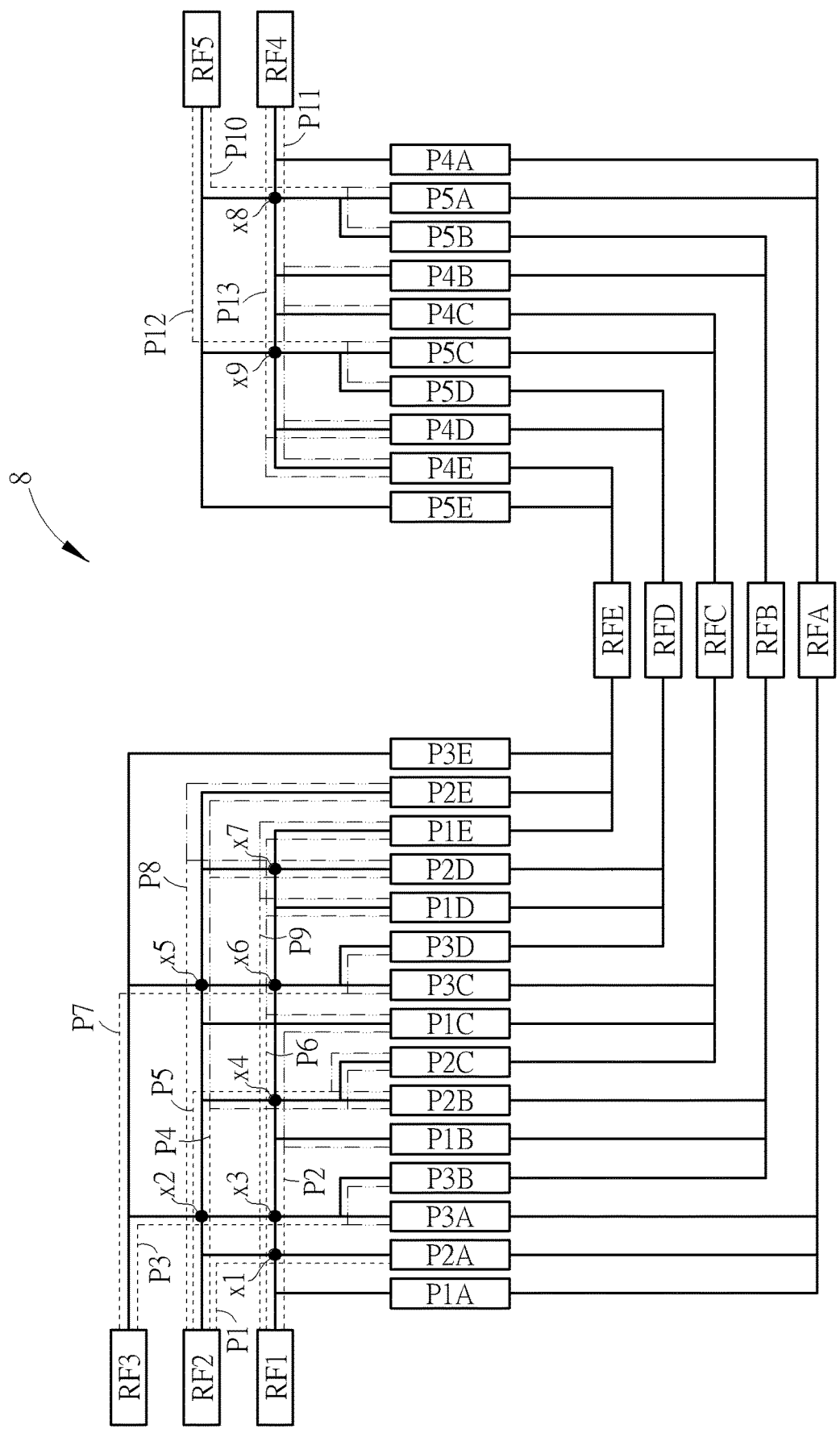
FIG. 8 is a schematic diagram of a switch circuit structure according to another embodiment of the invention.

FIG. 8 is a schematic diagram of a switch circuit structure 8 according to another embodiment of the invention. The switch circuit structure 8 in FIG. 8 is a 5-pole 5-throw circuit. The switch circuit structure 8 includes input terminals RF1 to RF5, output terminals RFA to RFE, switch paths P1A to P5A, P1B to P5B, P1C to P5C, and P1D to P5D, P1E to P5E, common paths P1 to P13.

The switch path P1A includes a first terminal, and a second terminal coupled to the output terminal RFA. The switch path P2A includes a first terminal, and a second terminal coupled to the output terminal RFA. The switch path P3A includes a first terminal, and a second terminal coupled to the output terminal RFA. The switch path P3B includes a first terminal, and a second terminal coupled to the output terminal RFB. The switch path P1B includes a first terminal, and a second terminal coupled to the output terminal RFB. The switch path P2B includes a first terminal, and a second terminal coupled to the output terminal RFB. The switch path P2C includes a first terminal, and a second terminal coupled to the output terminal RFC. The switch path P1C includes a first terminal, and a second terminal coupled to the output terminal RFC. The switch path P3C includes a first terminal, and a second terminal coupled to the output terminal RFC. The switch path P3D includes a first terminal, and a second terminal coupled to the output terminal RFD. The switch path P1D includes a first terminal, and a second terminal coupled to the output terminal RFD. The switch path P2D includes a first terminal, and a second terminal coupled to the output terminal RFD. The switch path P1E includes a first terminal, and a second terminal coupled to the output terminal RFE. The switch path P2E includes a first terminal, and a second terminal coupled to the output terminal RFE. The switch path P3E includes a first terminal, and a second terminal coupled to the output terminal RFE.

The first common path P1 is coupled to the input terminal RF2 and the first terminal of the switch path P2A. The second common path P2 is coupled to the input terminal RF1, the first terminal of the switch path P1B, and the first terminal of the switch path P1C. The third common path P3 is coupled to the input terminal RF3, the first terminal of the switch path P3A, and the first terminal of the switch path P3B. The fourth common path P4 is coupled to the input terminal RF2, the first terminal of the switch path P2B, the first terminal of the switch path P2C, the first terminal of the switch path P2D, and the first terminal of the switch path P2E. The fifth common path P5 is coupled to the input terminal RF2, the first terminal of the switch path P2B, and the first terminal of the switch path P2C. The sixth common path P6 is coupled to the input terminal RF1, the first terminal of the switch path P1C, the first terminal of the switch path P1D, and the first terminal of the switch path P1E. The seventh common path P7 is coupled to the input terminal RF3, the first terminal of the switch path P3C, and the first terminal of the switch path P3D. The eighth common path P8 is coupled to the input terminal RF2, the first terminal of the switch path P2D, and the first terminal of the switch path P2E. The ninth common path P9 is coupled to the input terminal RF1, the first terminal of the switch path P1D, and the first terminal of the switch path P1E. The first common path P1 and the second common path P2 cross each other on different planes to form a crossover x1. The third common path P3 and the fourth common path P4 cross each other on different planes to form a crossover x2. The second common path P2 and the third common path P3 cross each other on different planes to form a crossover x3. The fifth common path P5 and the sixth common path P6 cross each other on different planes to form a crossover x4. The seventh common path P7 and the eighth common path P8 cross each other on different planes to form a crossover x5. The seventh common path P7 and the ninth common path P9 cross each other on different planes to form a crossover x6. A path between the input terminal RF2 and the switch path P2D and a path between the input terminal RF1 and the switch path P1E cross each other on different planes to form a crossover x7. The distances between the switch paths P1A, P2A, P3A, P3B, P1B, P2B, P2C, P1C, P3C, P3D, P1D, P2D, P1E, P2E, P3E and the input terminals RF1, RF2, RF3 increase in sequence.

The switch path P4A includes a first terminal, and a second terminal coupled to the output terminal RFA. The switch path P5A includes a first terminal, and a second terminal coupled to the output terminal RFA. The switch path P5B includes a first terminal, and a second terminal coupled to the output terminal RFB. The switch path P4B includes a first terminal, and a second terminal coupled to the output terminal RFB. The switch path P4C includes a first terminal, and a second terminal coupled to the output terminal RFC. The switch path P5C includes a first terminal, and a second terminal coupled to the output terminal RFC. The switch path P5D includes a first terminal, and a second terminal coupled to the output terminal RFD. The switch path P4D includes a first terminal, and a second terminal coupled to the output terminal RFD. The switch path P4E includes a first terminal, and a second terminal coupled to the output terminal RFE. The switch path P5E includes a first terminal, and a second terminal coupled to the output terminal RFE.

The tenth common path P10 is coupled to the input terminal RF5, the first terminal of the switch path P5A, and the first terminal of the switch path P5B. The eleventh common path P11 is coupled to the input terminal RF4, the first terminal of the switch path P4B, the first terminal of the switch path P4C, the first terminal of the switch path P4D, and the first terminal of the switch path P4E. The twelfth common path P12 is coupled to the input terminal RF5, the first terminal of the switch path P5C, and the first terminal of the switch path P5D. The thirteenth common path P13 is coupled to the input terminal RF4, the first terminal of the switch path P4D, and the first terminal of the switch path P4E. The tenth common path P10 and the eleventh common path P11 cross each other on different planes to form a crossover x8. The twelfth common path P12 and the thirteenth common path P13 cross each other on different planes to form a crossover x9. The distances between the switch paths P4A, P5A, P5B, P4B, P4C, P5C, P5D, P4D, P4E, P5E and the input terminals RF4, RF5 increase in sequence.

The input terminal RF1 may be coupled to the switch paths P1A, P1B, P1C, P1D, and P1E along paths in a first direction, the input terminal RF2 may be coupled to the switch paths P2A, P2B, P2C, P2D, and P2E along paths in the first direction, the input terminal RF3 may be coupled to the switch paths P3A, P3B, P3C, P3D, and P3E along paths in the first direction, the input terminal RF4 may be coupled to the switch paths P4A, P4B, P4C, P4D, and P4E along paths in the first direction, and the input terminal RF5 may be coupled to the switch paths P5A, P5B, P5C, P5D, and P5E along paths in the first direction, herein the first direction could be vertical direction. The output terminal RFA may be coupled to the switch paths P1A, P2A, P3A, P4A, and P5A along paths in a second direction, the output terminal RFB may be coupled to the switch paths P1B, P2B, P3B, P4B, and P5B along paths in the second direction, the output terminal RFC may be coupled to the switch paths P1C, P2C, P3C, P4C, and P5C along paths in the second direction, the output terminal RFD may be coupled to the switch paths P1D, P2D, P3D, P4D, and P5D along the paths in the second direction, and the output terminal RFE may be coupled to the switch paths P1E, P2E, P3E, P4E, and P5E along the paths in the second direction, herein the second direction could be vertical direction. The first direction may be the direction of arranging the output terminals RFA, RFB, RFC, RFD, and RFE, such as along the vertical direction. The second direction may be the direction of arranging the switch paths, such as along the horizontal direction. The first direction and the second direction may be different. In some embodiments, the first direction and the second direction may be perpendicular to each other.

While the crossovers in FIGS. 6-8 are all arranged between the input terminals and the switch paths, in some embodiments, the crossovers can also be arranged between the switch paths and the output terminals, or partly between the input terminals and the switch paths and partly between the switch paths and the output terminals, while maintaining the number of crossovers unchanged.

Further, while the terminals RF1 to RF5 in FIGS. 6-8 are used as input terminals and the terminals RFA to RFE are used as output terminals, the present invention is not limited thereto, those skilled in the art will recognize that the terminals RF1 to RF5 may also be used as output terminals and the terminals RFA to RFE may be used as input terminals.

Furthermore, the input terminals RF1 to RF5 in the specification correspond to the RF1st to RF5th input terminals in the claims of the present application, and the output terminals RFA to RFE in the specification correspond to the RFA-th to RFE-th output terminals in the claims of the present application. The switch paths P1A to P1E, P2A to P2E, P3A to P3E, P4A to P4E, and P5A to P5E in the specification correspond to P1A-th to P1E-th, P2A-th to P2E-th, P3A-th to P3E-th, P4A-th to P4E-th, and P5A-th to P5E-th path in the claims of the present application.

Figure 9:
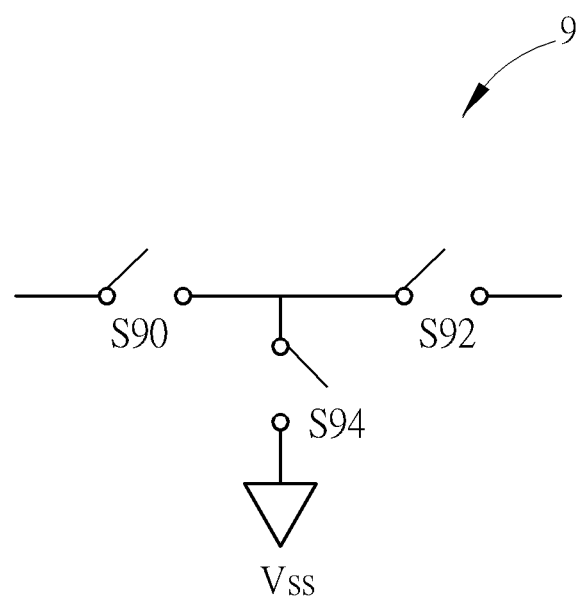
FIG. 9 is a schematic diagram of a switch path.

FIG. 9 is a schematic diagram of a switch path 9. The switch paths P1A to P5A, P1B to P5B, P1C to P5C, P1D to P5D, and P1E to P5E in FIGS. 6 to 8 may be realized by the switch path 9. The switch path 9 includes switches S90, S92, and S94. The switch S90 includes a control terminal, a first terminal coupled to an input terminal, and a second terminal. The switch S94 includes a control terminal, a first terminal coupled to the second terminal of the switch S90, and a second terminal coupled to a ground terminal. The ground terminal is used to provide a ground voltage Vss, such as 0V. The switch S92 includes a control terminal, a first terminal coupled to the second terminal of the switch S90, and a second terminal coupled to an output terminal. The switches S90, S92, and S94 may be implemented by transistors. The switch path 9 may be configured into a turn-on state or a turn-off state. In the turn-on state, the switches S90 and S92 may be turned on and the switch S94 may be turned off, the switches S90 and S92 may be regarded as series resistors, and the switch S94 may be regarded as a grounding capacitor. In the turn-off state, the switches S90 and S92 may be turned off and the switch S94 may be turned on, the switches S90 and S92 may be regarded as series capacitors, and the switch S94 may be regarded as a grounding resistor.

The embodiments in FIGS. 3 and 6-8 can significantly reduce the number of crossovers, reduce the insertion loss, and enhance the signal quality of the switch circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency switch circuit structure comprising:
   an RF1-st input terminal;
   an RF2-nd input terminal;

an RFA-th output terminal;
an RFB-th output terminal;
an RFC-th output terminal;
a P1A-th path comprising a first terminal coupled to the RF1-st input terminal, and a second terminal coupled to the RFA-th output terminal;
a P2A-th path comprising a first terminal, and a second terminal coupled to the RFA-th output terminal;
a P1B-th path comprising a first terminal, and a second terminal coupled to the RFB-th output terminal;
a P1C-th path comprising a first terminal, and a second terminal coupled to the RFC-th output terminal;
a first common path coupled to the RF2-nd input terminal and the first terminal of the P2A-th path; and
a second common path coupled to the RF1-st input terminal, the first terminal of the P1B-th path, and the first terminal of the P1C-th path;
wherein the first common path and the second common path cross each other on different planes to form a first crossover;
the P1A-th path does not form a crossover with any common path or any path of the switch circuit structure; and
the P2A-th path and the P1B-th path are not coupled to each other.

2. The radio frequency switch circuit structure of claim 1, further comprising:
a P2B-th path comprising a first terminal, and a second terminal coupled to the RFB-th output terminal;
wherein the first common path is further coupled to the first terminal of the P2B-th path.

3. The radio frequency switch circuit structure of claim 2, wherein distances between the P1A-th path, the P2A-th path, the P2B-th path, the P1B-th path and the P1C-th path, and the RF1-st input terminal increase in sequence; and
distances between the P1A-th path, the P2A-th path, the P2B-th path, the P1B-th path and the P1C-th path, and the RF2-nd input terminal increase in sequence.

4. The radio frequency switch circuit structure of claim 3, further comprising:
an RF3-rd input terminal;
a P2C-th path comprising a first terminal coupled to the RF2-nd input terminal, and a second terminal coupled to the RFC-th output terminal;
a P3A-th path comprising a first terminal coupled to the RF3-rd input terminal, and a second terminal coupled to the RFA-th output terminal;
a P3B-th path comprising a first terminal coupled to the RF3-rd input terminal, and a second terminal coupled to the RFB-th output terminal; and
a P3C-th path comprising a first terminal coupled to the RF3-rd input terminal, and a second terminal coupled to the RFC-th output terminal;
wherein the RF1-st input terminal is coupled to the P1A-th path, the P1B-th path, and the P1C-th path along a first direction;
the RF2th input terminal is coupled to the P2A-th path, the P2B-th path, and the P2C-th path along the first direction;
the RF3th input terminal is coupled to the P3A-th path, the P3B-th path, and the P3Cth path along the first direction;
the RFA-th output terminal is coupled to the P1A-th path, the P2A-th path, and the P3A-th path along a second direction;
the RFB-th output terminal is coupled to the P1B-th path, the P2B-th path, and the P3B-th path along the second direction;
the RFC-th output terminal is coupled to the P1C-th path, the P2C-th path, and the P3C-th path along the second direction; and
the first direction and the second direction are different.

5. The radio frequency switch circuit structure of claim 2, further comprising:
an RFD-th output terminal; and
a P1D-th path comprising a first terminal coupled to the RF1-st input terminal, and a second terminal coupled to the RFD-th output terminal.

6. The radio frequency switch circuit structure of claim 5, further comprising:
a P2C-th path comprising a first terminal, and a second terminal coupled to the RFC-th output terminal;
wherein a path from the RF2-nd input terminal to the P2C-th path and a path from the RF1-st input terminal to the P1D-th path cross each other on different planes to form a second crossover.

7. The radio frequency switch circuit structure of claim 5, further comprising:
an RF3-rd input terminal;
an RF4-th input terminal;
a P4A-th path comprising a first terminal, and a second terminal coupled to the RFA-th output terminal;
a P4B-th path comprising a first terminal, and a second terminal coupled to the RFB-th output terminal;
a P3B-th path comprising a first terminal, and a second terminal coupled to the RFB-th output terminal;
a P3C-th path comprising a first terminal, and a second terminal coupled to the RFC-th output terminal;
a P3D-th path comprising a first terminal, and a second terminal coupled to the RFD-th output terminal;
a third common path coupled to the RF4-th input terminal, the first terminal of the P4A-th path, and the first terminal of the P4B-th path; and
a fourth common path coupled to the RF3-rd input terminal, the first terminal of the P3B-th path, the first terminal of the P3C path;
wherein the third common path and the fourth common path cross each other on different planes to form a third crossover.

8. The radio frequency switch circuit structure of claim 7, further comprising:
a P4C-th path comprising a first terminal, and a second terminal coupled to the RFC-th output terminal; and
a P3D-th path comprising a first terminal, and a second terminal coupled to the RFD-th output terminal;
wherein a path from the RF4-th input terminal to the P4C-th path and a path from the RF3-rd input terminal to the P3D-th path cross each other on different planes to form a fourth crossover.

9. The radio frequency switch circuit structure of claim 5, wherein distances between the P1A-th path, the P2A-th path, the P2B-th path, the P1B-th path and the P1C-th path, and the RF1-st input terminal increase in sequence; and
distances between the P1A-th path, the P2A-th path, the P2B-th path, the P1B-th path and the P1C-th path, and the RF2-nd input terminal increase in sequence.

10. The radio frequency switch circuit structure of claim 9, wherein:
a P3A-th path comprising a first terminal coupled to the RF3-rd input terminal, and a second terminal coupled to the RFA-th output terminal;

wherein distances between the P3A-th path, the P4A-th path, the P4B-th path, the P3B-th path and the P3C-th path, and the RF3-rd input terminal increase in sequence; and distances between the P3A-th path, the P4A-th path, the P4B-th path, the P3B-th path and the P3C-th path, and the RF4-th input terminal increase in sequence.

11. The radio frequency switch circuit structure of claim 1, further comprising:
an RFD-th output terminal;
an RFE-th output terminal;
a P1D-th path comprising a first terminal coupled to the RF1-st input terminal, and a second terminal coupled to the RFD-th output terminal; and
a P1E-th path comprising a first terminal coupled to the RF1-st input terminal, and a second terminal coupled to the RFE-th output terminal.

12. The radio frequency switch circuit structure of claim 11, further comprising:
a P2B-th path comprising a first terminal, and a second terminal coupled to the RFB-th output terminal;
a P2C-th path comprising a first terminal, and a second terminal coupled to the RFC-th output terminal;
a P2D-th path comprising a first terminal, and a second terminal coupled to the RFD-th output terminal;
a P2E-th path comprising a first terminal, and a second terminal coupled to the RFE-th output terminal;
a P3A-th path comprising a first terminal, and a second terminal coupled to the RFA-th output terminal;
a P3B-th path comprising a first terminal, and a second terminal coupled to the RFB-th output terminal;
a P3C-th path comprising a first terminal, and a second terminal coupled to the RFC-th output terminal;
a P3D-th path comprising a first terminal, and a second terminal coupled to the RFD-th output terminal;
a P3E-th path comprising a first terminal, and a second terminal coupled to the RFE-th output terminal;
an RF3-rd input terminal;
a third common path coupled to the RF3-rd input terminal, the first terminal of the P3A-th path, and the first terminal of the P3B-th path;
a fourth common path coupled to the RF2-nd input terminal, the first terminal of the P2B-th path, the first terminal of the P2C-th path, the first terminal of the P2D-th path, and the first terminal of the P2E-th path;
a fifth common path coupled to the RF2-nd input terminal, the first terminal of the P2B-th path, and the first terminal of the P2C-th path;
a sixth common path coupled to the RF1-st input terminal, the first terminal of the P1C-th path, the first terminal of the P1D-th path, and the first terminal of the P1E-th path;
a seventh common path coupled to the RF3-rd input terminal, the first terminal of the P3C-th path, and the first terminal of the P3D-th path;
an eighth common path coupled to the RF2-nd input terminal, the first terminal of the P2D-th path, and the first terminal of the P2E-th path; and
a ninth common path coupled to the RF1-st input terminal, the first terminal of the P1D-th path, and the first terminal of the P1E-th path;
wherein the third common path and the fourth common path cross each other on different planes to form a second crossover;
the second common path and the third common path cross each other on different planes to form a third crossover;
the fifth common path and the sixth common path cross each other on different planes to form a fourth crossover;
the sixth common path and the eighth common path cross each other on different planes to form a fifth crossover;
the seventh common path and the ninth common path cross each other on different planes to form a sixth crossover; and
a path from the RF2-nd input terminal to the P2D-th path and a path from the RF1-st input terminal to the P1E-th path cross each other on different planes to form a seventh crossover.

13. The radio frequency switch circuit structure of claim 12, further comprising:
a P4A-th path comprising a first terminal, and a second terminal coupled to the RFA-th output terminal;
a P4B-th path comprising a first terminal, and a second terminal coupled to the RFB-th output terminal;
a P4C-th path comprising a first terminal, and a second terminal coupled to the RFC-th output terminal;
a P4D-th path comprising a first terminal, and a second terminal coupled to the RFD-th output terminal;
a P4E-th path comprising a first terminal, and a second terminal coupled to the RFE-th output terminal;
a P5A-th path comprising a first terminal, and a second terminal coupled to the RFA-th output terminal;
a P5B-th path comprising a first terminal, and a second terminal coupled to the RFB-th output terminal;
a P5C-th path comprising a first terminal, and a second terminal coupled to the RFC-th output terminal;
a P5D-th path comprising a first terminal, and a second terminal coupled to the RFD-th output terminal;
a P5E-th path comprising a first terminal, and a second terminal coupled to the RFE-th output terminal;
an RF4-th input terminal;
an RF5-th input terminal;
a tenth common path coupled to the RF5-th input terminal, the first terminal of the P5A-th path, and the first terminal of the P5B-th path;
an eleventh common path coupled to the RF4-th input terminal, the first terminal of the P4B-th path, the first terminal of the P4C-th path, the first terminal of the P4D-th path, and the first terminal of the P4E-th path;
a twelfth common path coupled to the RF5-th input terminal, the first terminal of the P5C-th path, and the first terminal of the P5D-th path;
a thirteenth common path coupled to the RF4-th input terminal, the first terminal of the P4D-th path, and the first terminal of the P4E-th path;
the tenth common path and the eleventh common path cross each other on different planes to form an eighth crossover; and
the twelfth common path and the thirteenth common path cross each other on different planes to form a ninth crossover.

14. The radio frequency switch circuit structure of claim 13, wherein:
a P4A-th path comprises a first terminal coupled to the RF4-th input terminal, and a second terminal coupled to the RFA-th output terminal;
distances between the P4A-th path, the P5A-th path, the P5B-th path, the P4B-th path, the P4C-th path, the P5C-th path, the P5D-th path, the P4D-th path and the P4E-th path, and the RF4-th input terminal increase in sequence;
distances between the P4A-th path, the P5A-th path, the P5B-th path, the P4B-th path, the P4C-th path, the P5C-th path, the P5D-th path, the P4D-th path and the P4E-th path, and the RF5-th input terminal increase in sequence;

distances between the P1A-th path, the P2A-th path, the P3A-th path, the P3B-th path, the P1B-th path, the P2B-th path and the P2C-th path, and the RF1-st input terminal increase in sequence;

distances between the P1A-th path, the P2A-th path, the P3A-th path, the P3B-th path, the P1B-th path, the P2B-th path and the P2C-th path, and the RF2-nd input terminal increase in sequence; and distances between the P1A-th path, the P2A-th path, the P3A-th path, the P3B-th path, the P1B-th path, the P2B-th path and the P2C-th path, and the RF3-rd input terminal increase in sequence.

15. The radio frequency switch circuit structure of claim 1, wherein each of the P2A-th path, the P1B-th path, and the P1C-th path comprises:
a first switch comprising:
a control terminal;
a first terminal coupled to the RF1-st input terminal or the RF2-nd input terminal; and
a second terminal;
a second switch comprising:
a control terminal;
a first terminal coupled to the second terminal of the first switch; and
a second terminal coupled to a ground terminal;
a third switch comprising:
a first terminal coupled to the second terminal of the first switch; and
a second terminal coupled to the first output terminal, the second output terminal or the third output terminal.

16. The radio frequency switch circuit structure of claim 1, wherein:
the switch circuit has N input terminals and N output terminals, where N is a positive integer exceeding 2; and
a quantity of crossovers of the switch circuits is equal to a square of (N−2).

17. A layout system comprising:
a memory configured to store code; and
a processor coupled to the memory, and configured to load the code from the memory to:
receive a circuit setting of a radio frequency switch circuit, the circuit setting comprising N input terminals, M output terminals and (N*M) switch paths, where N and M are positive integers;
divide the (N*M) switch paths into N sets of switch paths according to the N input terminal;
divide the N input terminals and the N sets of switch paths into a first set of circuits and a second set of circuits;
arrange the M output terminals between input terminals in the first set of circuits and input terminals in the second set of circuits; and
move one of the switch paths in the first set of circuits to reduce a quantity of crossovers of the switch path and form at least one path uncoupled from any other paths, so as to update the first set of circuits.

18. The layout system of claim 17, wherein the processor is further configured to:
move a switch path having a maximum quantity of crossovers in the first set of circuits to reduce the quantity of crossovers, so as to update the first set of circuits.

19. The layout system of claim 17, wherein the first set of circuits and the second set of circuits each comprises N/2 input terminals and corresponding N/2 sets of switch paths;
the processor is further configured to update the second set of circuits according to a mirror image of the updated first set of circuits; and
the processor is further configured to merge the updated first set of circuits and the updated second set of circuits to update the radio frequency switch circuit.

20. The layout system of claim 17, wherein the first set of circuits includes (N+1)/2 input terminals and corresponding (N+1)/2 sets of switch paths;
the second set of circuits includes (N−1)/2 input terminals and corresponding (N−1)/2 sets of switch paths;
the processor is further configured to move one of the (N−1)/2 switch paths of the second set of circuits to reduce a quantity of crossovers of the one of the of the (N−1)/2 switch paths to update the second set of circuits; and
the processor is further configured to merge the updated first set of circuits and the updated second set of circuits to update the radio frequency switch circuit.

* * * * *